(12) United States Patent
Takabe

(10) Patent No.: US 7,318,207 B2
(45) Date of Patent: Jan. 8, 2008

(54) APPARATUS AND METHOD FOR VERIFYING LAYOUT INTERCONNECTIONS USING POWER NETWORK ANALYSIS

(75) Inventor: Takashi Takabe, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 372 days.

(21) Appl. No.: 11/081,755

(22) Filed: Mar. 17, 2005

(65) Prior Publication Data
US 2005/0210432 A1    Sep. 22, 2005

(30) Foreign Application Priority Data
Mar. 19, 2004   (JP) .............................. 2004-080265

(51) Int. Cl.
*G06F 17/50*   (2006.01)
*G06F 9/45*    (2006.01)

(52) U.S. Cl. ...................... 716/5; 716/2; 716/3; 716/12; 703/2

(58) Field of Classification Search .................... 716/2, 716/3, 5, 12; 703/2
See application file for complete search history.

(56) References Cited

U.S. PATENT DOCUMENTS

| | | | |
|---|---|---|---|
| 5,379,231 A * | 1/1995 | Pillage et al. ................. | 703/14 |
| 5,581,475 A | 12/1996 | Majors | |
| 6,748,572 B2 * | 6/2004 | Fujine ............................ | 716/5 |
| 6,807,520 B1 * | 10/2004 | Zhou et al. .................... | 703/14 |
| 6,862,716 B2 | 3/2005 | Takabe | |
| 6,971,082 B2 * | 11/2005 | Shiratori ....................... | 716/13 |

FOREIGN PATENT DOCUMENTS

| | | |
|---|---|---|
| JP | 7-153845 | 6/1995 |
| JP | 2004-70548 A | 3/2004 |

OTHER PUBLICATIONS

Potash et al., Application of Unilateral and graph techniques to analysis of linear circuit, 1968, ACM, pp. 367-378.*

* cited by examiner

*Primary Examiner*—Jack Chiang
*Assistant Examiner*—Nghia M. Doan
(74) *Attorney, Agent, or Firm*—Foley & Lardner LLP

(57) ABSTRACT

A method for verifying layout interconnections includes extracting a loop circuit as a loop portion in a first circuit model. The first circuit model includes first branch interconnections included in the loop portion and second branch interconnections, first nodes, and terminals of circuit elements. The loop portion is replaced with a second node to generate a second circuit model which does not have a loop portion, based on the first circuit model. A second current value of each of the second branch interconnections is calculated, based on the second circuit model. A third circuit model of the loop portion is generated, based on the first interconnections. A first current value of each of the first branch interconnections is calculated, based on the third circuit model. The first and second current value are compared with a predetermined current value to carry out verification.

15 Claims, 8 Drawing Sheets

APPARATUS AND METHOD FOR VERIFYING LAYOUT INTERCONNECTIONS USING POWER NETWORK ANALYSIS

BACKGROUND OF THE INVENTION

1. Field of the Invention

The present invention relates to a layout interconnections verifying apparatus and a method for verifying layout interconnections. More particularly, the present invention relates to a layout interconnections verifying apparatus that can be used to judge whether or not layout interconnections satisfy a requirement with respect to a current based on whether or not a current flowing through each branch interconnection of the layout interconnections on a semiconductor device exceeds a predetermined current value, and a method for verifying layout interconnections that can do the same.

2. Description of the Related Art

In a semiconductor device design, a layout of interconnections is designed after circuit elements such as transistors and the like are placed. After the layout of the interconnections, if the current flowing through the interconnection is locally concentrated and exceeds the predetermined current value (standard value), it is expected that the interconnection is broken by causing electromigration. As avoiding such situation, the layout design is verified whether or not the portion, through which the current exceeding the standard value flows, exists in the interconnections after the layout.

Typically, the layout interconnections include a plurality of branch portions. Also, the elements such as the transistors and the like are placed at the end thereof. Usually, the layout interconnections are verified by replacing the interconnections after the layout with a interconnection model. FIG. 1 is a view showing a model of a part of the interconnections included in the semiconductor devices after the layout design. In this example, element terminals T21 to T25, such as sources or drains of the transistors or the like are connected to ends of branch interconnections Br21 to Br25, respectively.

With reference to FIG. 1, the values of the currents flowing through the element terminals T21 to T25 are determined in advance by simulation and the like. The current value of each branch interconnection is obtained by following the branch interconnection route with respect to the current value of each element terminal. For example, when the route, in which the current value I21 is outputted from the element terminal T21 and the current value I22 is outputted from the element terminal T22, are followed, the total of the currents flowing into a node N22 and the total of the currents flowing out from the node N22 are equal. Thus, the current value of the branch interconnection Br27 between the node N22 and the node N23 is obtained as I21+I22. The above-mentioned technique for calculating the current value of each branch interconnection is disclosed in, for example, Japanese Laid Open Patent Application JP H07-153845 A (FIG. 14), and Japanese Laid Open Patent Application JP 2004-70548 A. When the current value of each branch interconnection is obtained, whether or not there is the possibility of the occurrence of the electromigration is verified based on a width of each branch interconnection and an interconnection material and the like.

Incidentally, the branch interconnection for the mutual connection between the interconnections having the same potential is laid in the layout interconnections. In this case, a loop may be generated in the route. FIG. 2 is a view showing the model of the layout interconnections including the loop. In FIG. 2, the loop portion is generated by the branch interconnections for the mutual connections among nodes N31, N32, N33 and N34. When this loop is included in the interconnections, the current values of the branch interconnections in the loop portion cannot be obtained by simply adding the current values of element terminals T31 to T33 along the route.

Here, in the model shown in FIG. 2, when all of the branch interconnections are replaced with resistances to analysis them as a resistance circuit network, it is possible to obtain the current values of all the branch interconnections including the loop portion. However, this case has a problem that the calculation is complex which makes the time required to obtain the current value very long.

SUMMARY OF THE INVENTION

Therefore, an object of the present invention to provide a layout interconnections verifying apparatus and a method for verifying layout interconnections, which can obtain a current value of each branch interconnections in a short time, even if a loop portion is included in the interconnections.

In order to achieve an aspect of the present invention, the present invention provides a method for verifying layout interconnections including: (a) extracting a loop circuit as a loop portion in a first circuit model, wherein the first circuit model of a semiconductor design, includes: branch interconnections which includes first branch interconnections included in the loop portion and other branch interconnections as second branch interconnections, first nodes, each of which is connected with an edge of corresponding one of the branch interconnections, and terminals of circuit elements, each of which is connected with an edge of corresponding one of the branch interconnections; (b) replacing the loop portion with a second node to generate a second circuit model which does not have a loop portion, based on the first circuit model; (c) calculating a second current value of each of the second branch interconnections, based on the second circuit model; (d) generating a third circuit model of the loop portion, based on the first interconnections; (e) calculating a first current value of each of the first branch interconnections, based on the third circuit model; and (f) comparing the first and second current value with a predetermined current value to carry out verification.

The layout interconnections verifying apparatus and the method for verifying layout interconnections of the present invention, when the loop is generated in the layout interconnections targeted for a verification, divides the whole into a portion that does not includes the loop and a portion that includes the loop, and calculates the current values. Thus, the current value of each branch interconnection can be easily obtained, thereby reducing the time necessary for the entire verification of the layout interconnections.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Embodiments of a layout interconnections verifying apparatus and a method for verifying layout interconnections according to the present invention will be described below with reference to the attached drawings.

Figure 1:
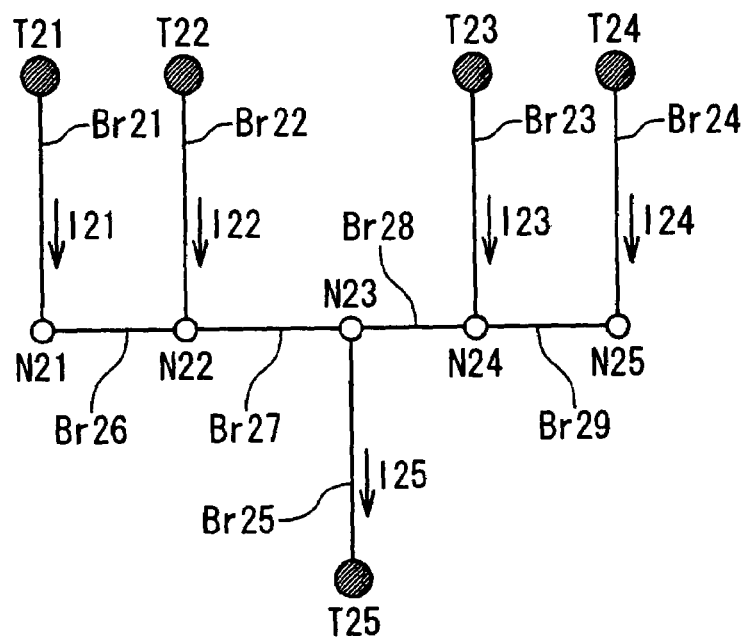
FIG. 1 is a view showing a model of a part of the interconnections included in the semiconductor devices after the layout design.
Figure 2:
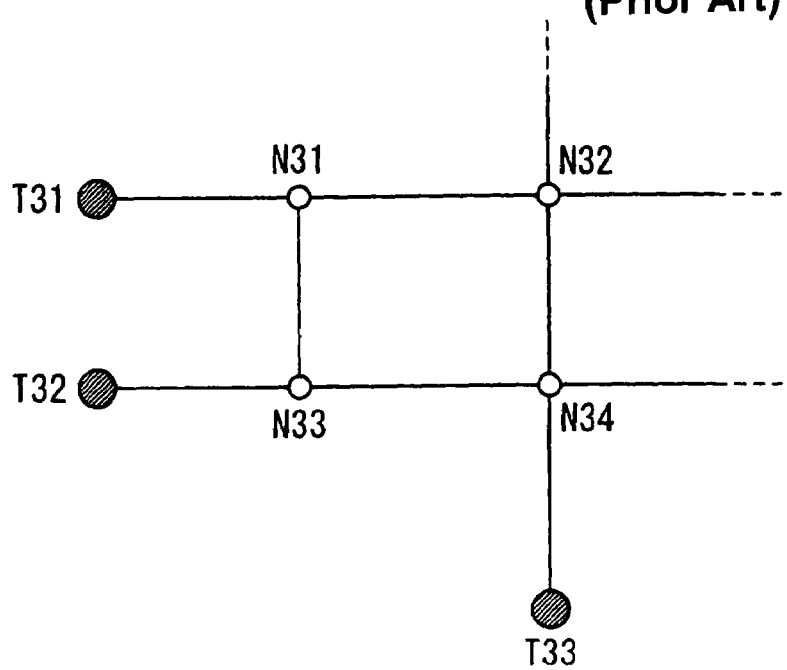
FIG. 2 is a view showing the model of the layout interconnections including the loop.
Figure 3:
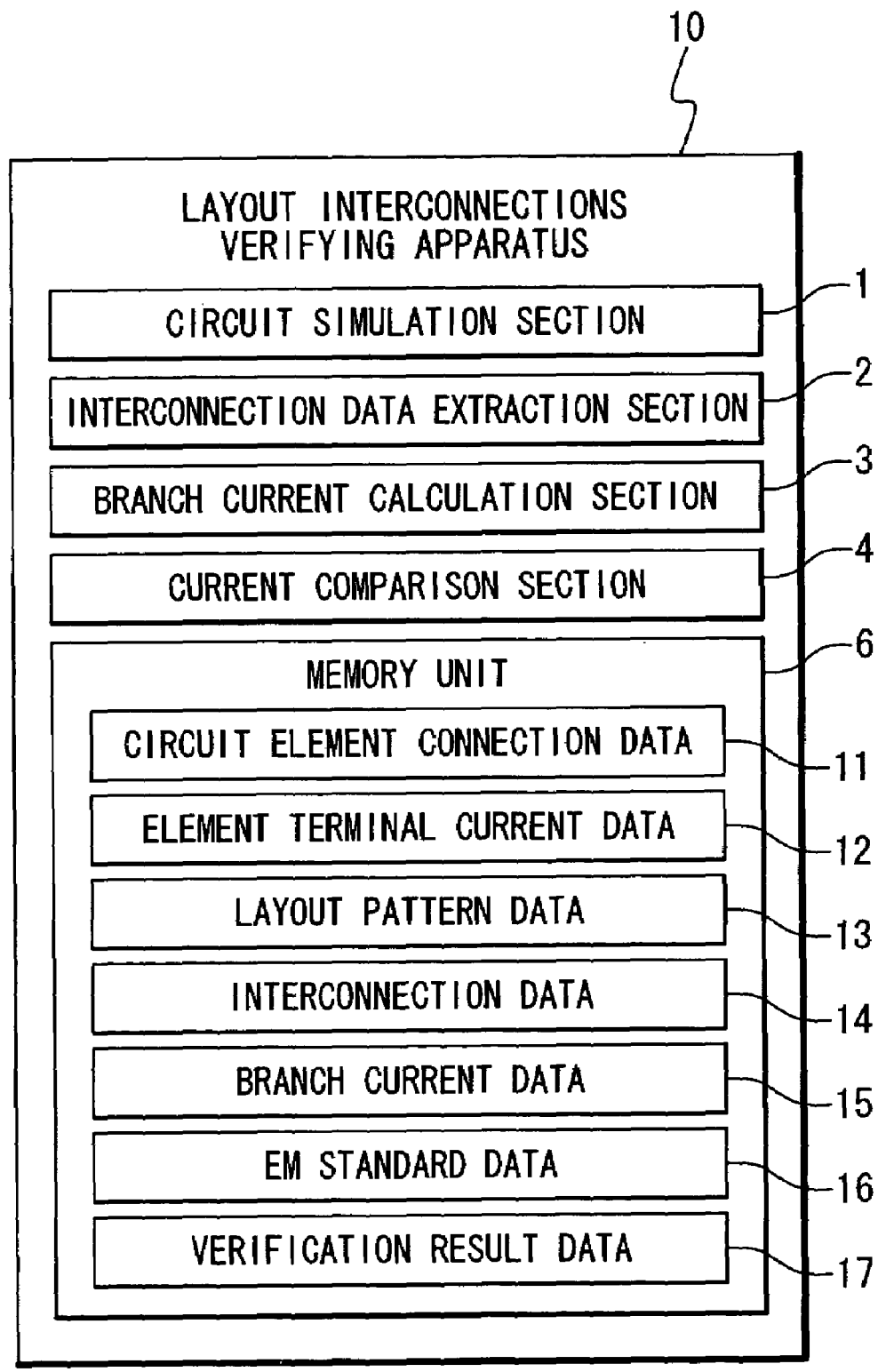
FIG. 3 is a view showing a configuration of the embodiment of a layout interconnections verifying apparatus according to the present invention.

FIG. 3 is a view showing a configuration of the embodiment of a layout interconnections verifying apparatus according to the present invention. The layout interconnections verifying apparatus 10 is an information processing unit such as an workstation or an personal computer. The layout interconnections verifying apparatus 10 includes programs of a circuit simulation section 1, an interconnection data extraction section 2, a branch current calculation section 3 and a current comparison section 4, and stores data of circuit element (component) connection data 11, element terminal current data 12, layout pattern data 13, interconnection data 14, branch current data 15, EM standard data 16, and verification result data 17 in a memory unit 6.

The circuit simulation section 1 carries out a simulation based on the circuit element connection data 11 to obtain the element terminal current data 12. The interconnection data extraction section 2 extracts the interconnection data 14 with regard to each layout interconnection from the layout pattern data 13. The branch current calculation section 3 generates the circuit model based on the element terminal current data 12 and the interconnection data 14, and calculates the current value of each branch interconnection based on the circuit model to obtain the branch current data 15. The current comparison section 4 calculates the current density of each branch interconnection based on the branch current data 15 and the interconnection data 14 of each branch interconnection, and compares the current density with the standard current density stored in the EM standard data 16. The memory unit 6 is exemplified as a RAM, a HDD and the like.

The circuit element connection data 11 are the data indicating connection among the circuit elements (components) such as transistors and the like in a semiconductor device. The element terminal current data 12 are the data indicating each current value flowing through each element terminal of each circuit element. The layout pattern data 13 are data indicating placement positions of the circuit elements and the interconnections, and placement shapes of the circuit elements and the interconnections on the semiconductor device. The interconnection data 14 are data indicating placement positions and placement shapes of the interconnections. The interconnection data 14 includes the data with regard to: interconnection widths and resistances of the interconnections, for example, made of metal or polysilicon; and terminals of the connected circuit elements (the element terminals). The branch current data 15 are data indicating the current value of each branch interconnection calculated based on the circuit model of the interconnections. The EM (electromigration) standard data 16 are data indicating a current density serving as a standard value with respect to an electromigration occurrence, correspondingly to the interconnection material. The verification result data 17 are data indicating whether or not a current value of each branch interconnection exceeds the standard current density, and the required minimum interconnection width not exceeding the standard current density.

Figure 4:
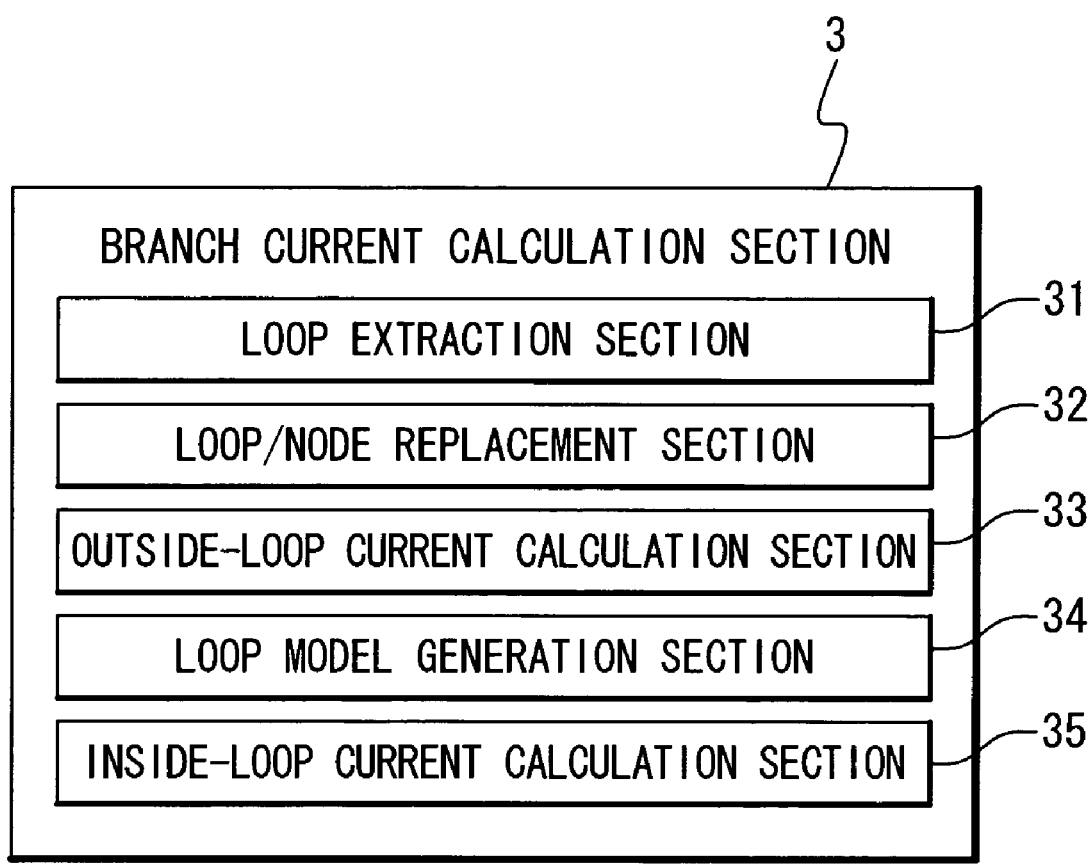
FIG. 4 is a view showing a configuration of the embodiment of branch current calculation section 3.

FIG. 4 is a view showing a configuration of the embodiment of branch current calculation section 3. The branch current calculation section 3 includes a loop extraction section 31, a loop/node replacement section 32, a outside-loop current calculation section 33, a loop model generation section 34, and an inside-loop current calculation section 35.

The loop extraction section 31 extracts the loop portion included in the circuit model. The loop/node replacement section 32 replaces the plurality of nodes generating the loop portion with one new node, when the loop portion is extracted. The outside-loop current calculation section 33 calculates the current value of each branch interconnection by using the circuit model which does not have the loop portion, except the current value of the branch interconnections generating the loop portion. The loop model generation section 34 generates a circuit model with regard to the branch interconnections of the loop portion. The inside-loop current calculation section 35 calculate the current value of each branch interconnection generating the loop portion by using the circuit model generated at the step S34.

Figure 5:
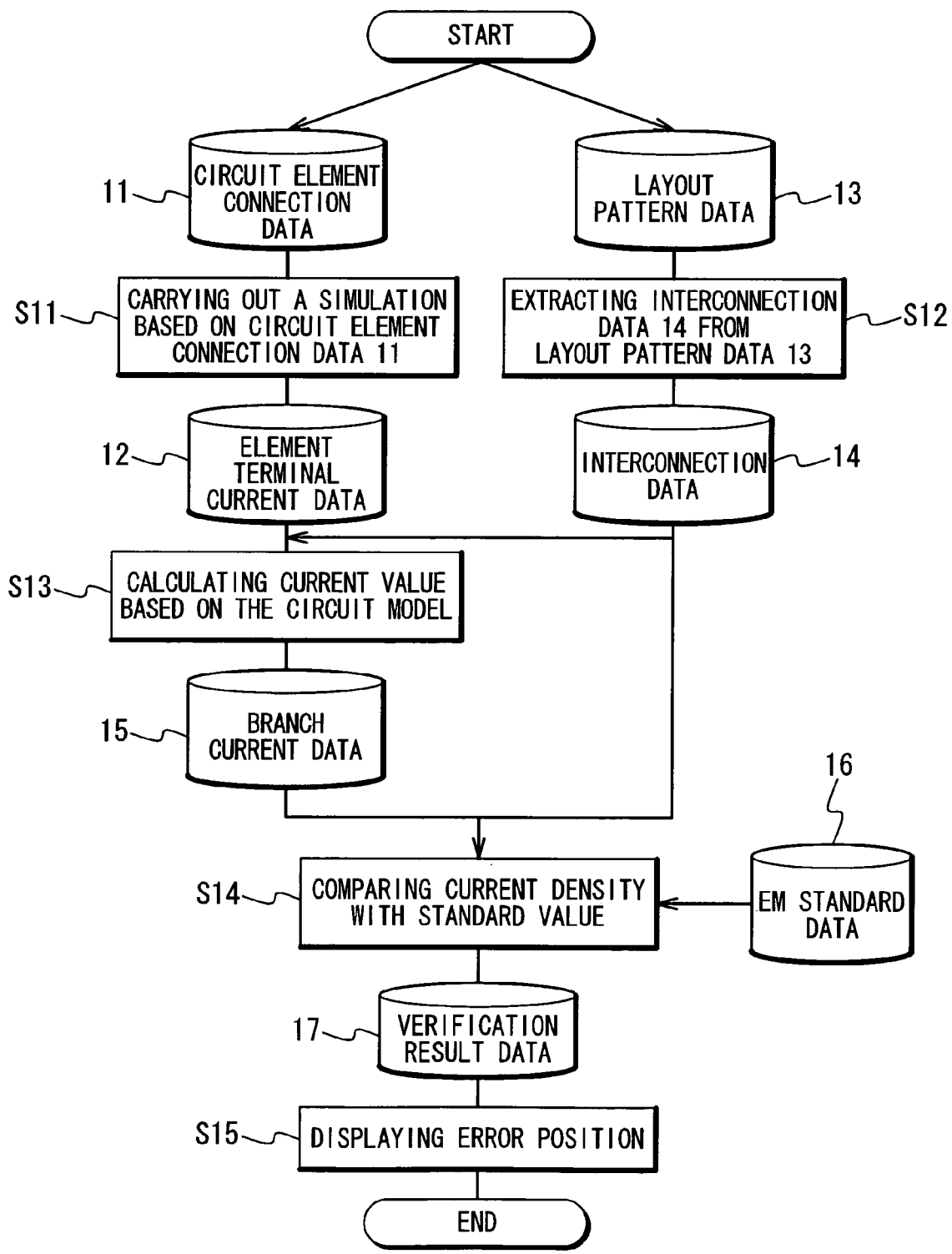
FIG. 5 is a view flowchart showing the procedure of the embodiment of the method for verifying layout interconnections of the present invention.

FIG. 5 is a view flowchart showing the procedure of the embodiment of the method for verifying layout interconnections of the present invention. The method for verifying layout interconnections in this embodiment is executed by using the layout interconnections verifying apparatus.

Prior to verifying the layout interconnections, the circuit element (component) connection data 11 and the layout pattern data 13 has been obtained by carried out placement and placing process in the semiconductor designing process. The layout data, including the circuit element connection data 11 and the layout pattern data 13, have been stored in the memory unit 6.

The circuit simulation section 1 carries out a simulation based on the circuit element connection data 11. In the simulation, the value of the current flowing through a terminal of each circuit element is calculated to obtain the element terminal current data 12. The circuit simulation section 1 stores the element terminal current data 12 in the memory unit 6 (Step S11).

The interconnection data extraction section 2 extracts the interconnection data 14 with respect to each layout interconnection from the layout pattern data 13 and stores the data in the memory unit 6 (Step S12).

The branch current calculation section 3 generates the circuit model based on the element terminal current data 12 generated in the step S11 and the interconnection data 14 extracted in the step S12. Then, the branch current calculation section 3 calculates the current value of each branch interconnection based on the circuit model, and stores calculated current values as the branch current data 15 in the memory unit 6 (Step S13).

Figure 6:
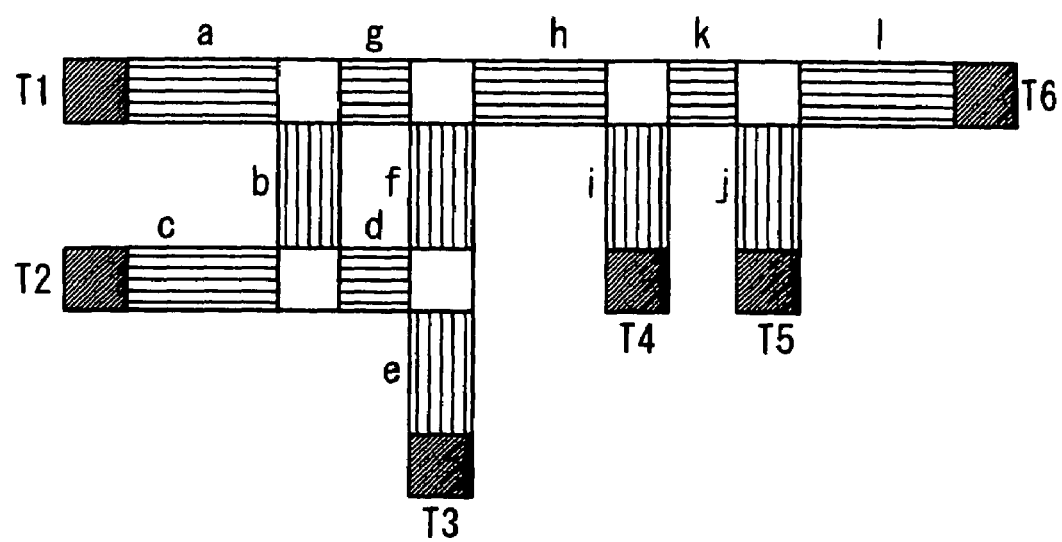
FIG. 6 is a schematic diagram showing an example of the layout interconnections targeted for the verification.
Figure 7:
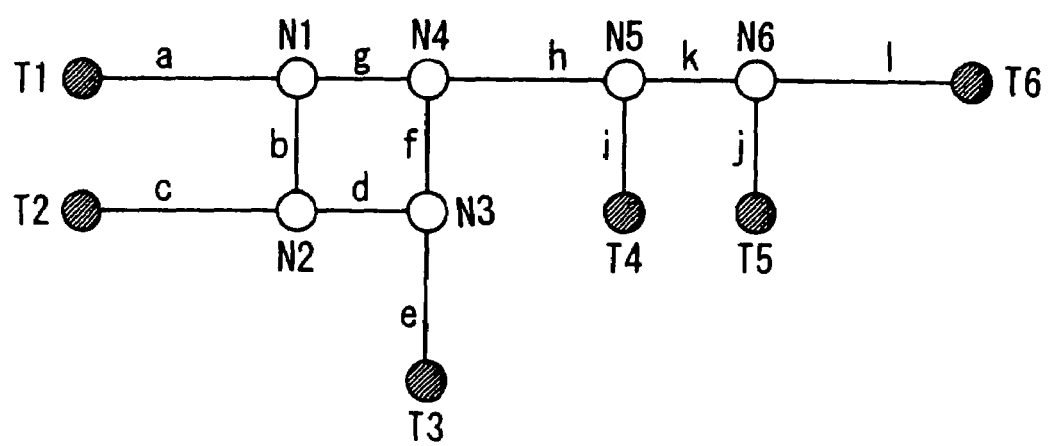
FIG. 7 is a schematic diagram showing the circuit model generated based on the layout interconnections shown in FIG. 6.

FIG. 6 is a schematic diagram showing an example of the layout interconnections targeted for the verification. FIG. 7 is a schematic diagram showing the circuit model (first circuit model) generated based on the layout interconnections shown in FIG. 6. In FIG. 6, a portion with hatching indicates the element terminal. A portion of an open square indicates a branch point of the interconnection. A portion with a stripe indicates the branch interconnection. In FIG. 7, nodes N1 to N6 (open circles) correspond to the branch points of the interconnections in FIG. 6, respectively. Element terminals T1 to T6 (solid circles) correspond to element terminals T1 to T6 in FIG. 6, respectively. Branch interconnections "a" to "1" (solid lines) correspond to branch interconnections "a" to "1" in FIG. 6, respectively.

In the step S13 of FIG. 5, the branch current calculation section 3 gives labels "a" to "1" on the branch interconnections between the nodes, and between the node and the element terminal, respectively. Then, the value of the current flowing through each branch interconnection is calculated as described below.

Figure 8:
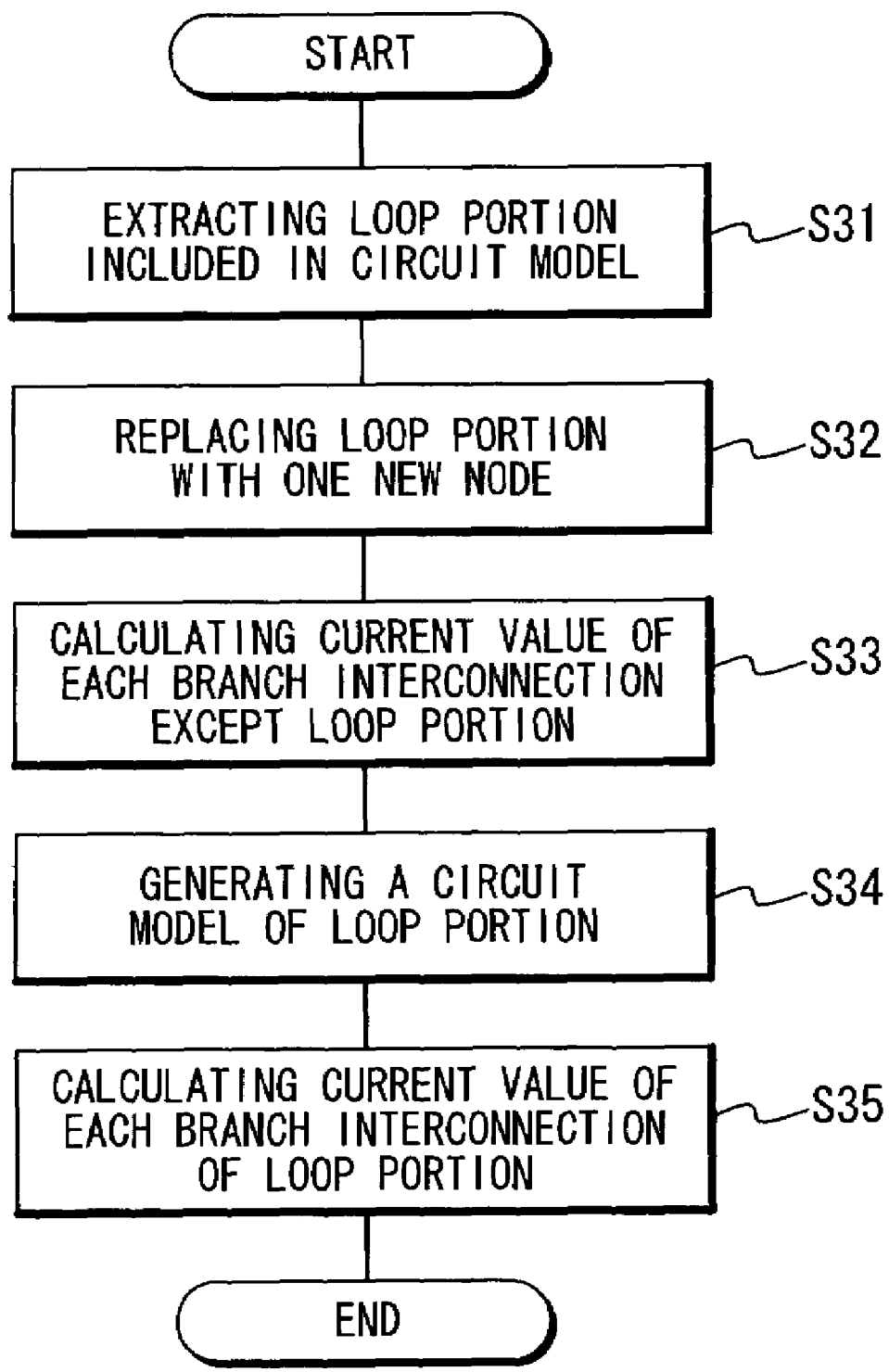
FIG. 8 is a flowchart showing a detailed procedure for calculating the current of each branch interconnection in the step S13.

FIG. 8 is a flowchart showing a detailed procedure for calculating the current of each branch interconnection in the step S13. The loop extraction section 31 extracts the loop portion included in the circuit model (Step S31). For example, the loop portion is extracted by defining each node as a start point node and examining whether or not it can arrive at the start point node without passing through the same branch interconnection. In the circuit model shown in FIG. 7, when the node N1 is defined as the start point node, it can arrive at the start point node N1 itself through branch interconnections b, d, f and g. Thus, in the step S31, the loop generated by the branch interconnections b, d, f and g (the nodes N1 to N4) is extracted.

Figure 9:
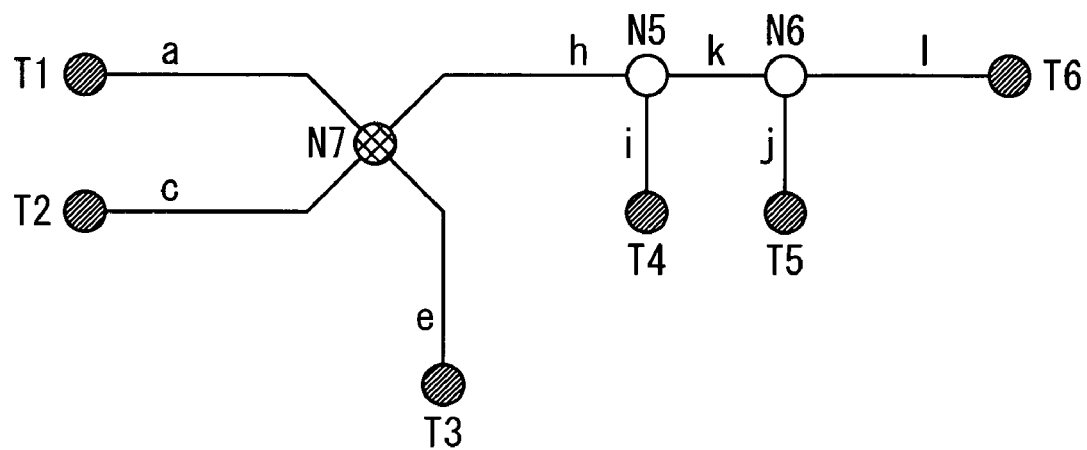
FIG. 9 is a schematic diagram showing the circuit model after the replacing process in the step S32.

The loop/node replacement section 32 replaces the plurality of nodes generating the loop portion with one new node, when the loop portion is extracted (Step S32). When the plurality of loop portions are generated at the portions different from each other in the circuit model prior to this replacing process, the loop/node replacement section 32 carries out this replacing process until all loop portions are replaced with new nodes, respectively in the circuit model. FIG. 9 is a schematic diagram showing the circuit model (second circuit model) after the replacing process in the step S32. In FIG. 7, since the nodes N1 to N4 generating the loop portion are replaced with one node of a node N7 (hatching circle), the circuit model which does not include the loop portion is obtained as shown in FIG. 9.

The outside-loop current calculation section 33 calculates the current value of each branch interconnection by using the circuit model which does not have the loop portion after the replacing process in the step S32, except the current value of the branch interconnections generating the loop portion (Step S33). In the step S33, the loop portion does not exist in the circuit model used to calculate the current value. Thus, by following the current values of the element terminals, the current value of each branch interconnection can be obtained inside the circuit model. For example, among the respective branch interconnections, as for the branch interconnection connected to the element terminal, its current value is obtained from the element terminal current data 12 (FIG. 5). Also, as for the branch interconnection which is not directly connected to the element terminal, the fact that the sum of the currents flowing into the respective nodes is 0 (the Kirchhoff's first law) is used to obtain from the branch interconnection connected to the element terminal. Consequently, the current value is determined.

In the example of FIG. 9, the current value of a branch interconnection "j" is equal to the current value of the element terminal T5, and the current value of a branch interconnection "l" is equal to the current value of the element terminal T6. The current value of a branch interconnection "k" is calculated by using the fact that the value of the current flowing into the node N6 is equal to the value of the current flowing out from the node N6, based on the current value of the branch interconnection "j" and the current value of the branch interconnection "l". Also, when the current value of the branch interconnection "k" is calculated, the current value of a branch interconnection "h" is calculated based on the current value of the branch interconnnection "k" connected to the node N5 and the current value of a branch interconnection "i".

The loop model generation section 34 generates a circuit model (third circuit model) with regard to the branch interconnections of the loop portion, after the current value of the branch interconnections except for the branch interconnections generating the loop portion is calculated in the step S33 (Step S34). In the step S34, for example, the circuit model constituted by a resistive network is generated, in which each branch interconnection generating the loop portion is replaced with a resistance element.

The inside-loop current calculation section 35 calculate the current value of each branch interconnection generating the loop portion by using the circuit model generated at the step S34 (Step S35). In the step S35, the current value of the branch interconnection which flows into the loop portion calculated in the step S33 is used for the calculation. In the steps S33, S34, the value of the current flowing through all of the branch interconnections inside the circuit model (FIG. 7) targeted for the calculation is calculated.

Figure 10:
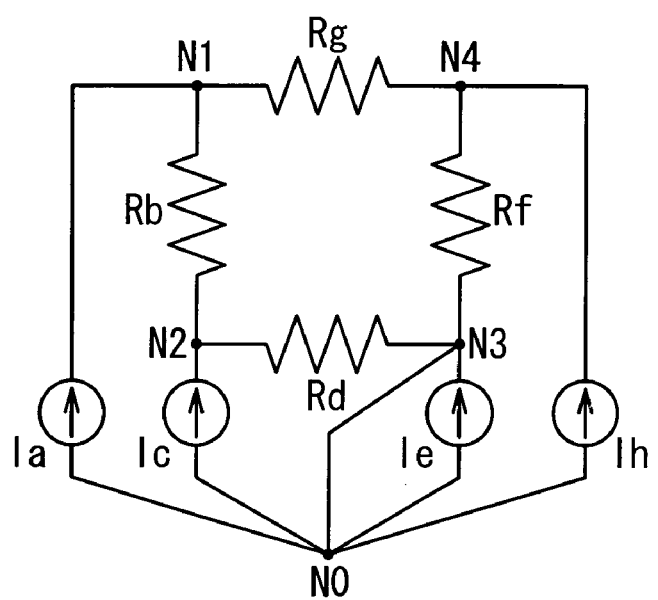
FIG. 10 is a circuit diagram showing the resistive network of the loop portion in the circuit model shown in FIG. 7.

FIG. 10 is a circuit diagram showing the resistive network of the loop portion in the circuit model shown in FIG. 7. This resistive network is generated in the step S34. In FIG. 10, the resistance in each branch interconnection is represented as a resistance R with an appropriate label as a subscript. For example, a resistance Rb indicates a interconnection resistance of a branch interconnection "b" in FIG. 7. Also, the current of the branch interconnection flowing into the loop portion indicates a current source I with the appropriate label as the subscript. For example, a current source Ia indicates the current value of a branch interconnection "a" in FIG. 7.

In FIG. 9, the sum of the currents flowing into the node N7 is 0. Thus, the current sources Ia, Ic, Ie and Ih can be connected through a node N0 as shown in FIG. 10. Also, since only the current sources are connected to the node N0, the potential of the node N0 can be arbitrarily selected. Hence, for example, as shown in FIG. 10, even if the node N0 and the node N3 are short-circuited, the calculation result is not changed. In the step S35, such a resistive network is used to calculate the current value of each branch interconnection in the loop portion.

Figure 11:
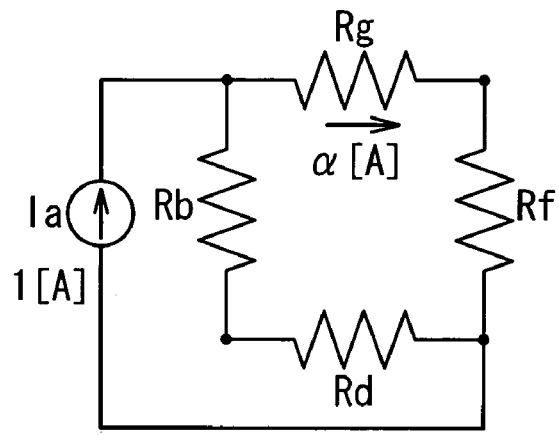
FIGS. 11 to 13 are circuit diagrams showing the manners for calculating the current value Ig of each branch interconnection "g" based on the case of FIG. 10.
Figure 12:
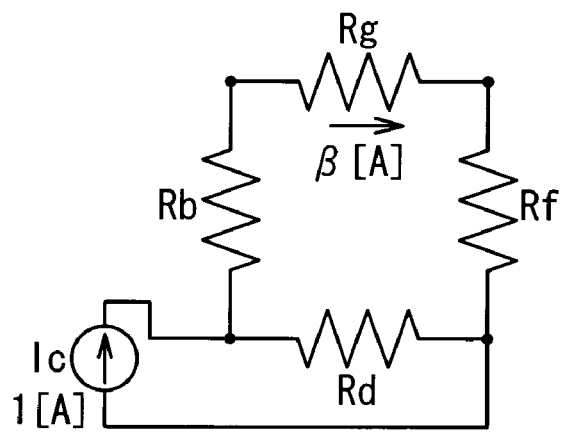
Figure 13:
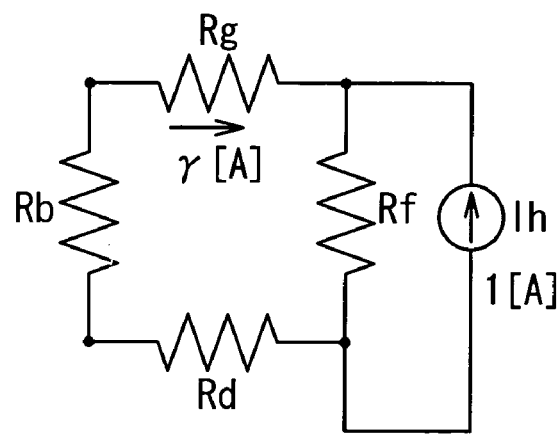

FIGS. 11 to 13 are circuit diagrams showing the manners for calculating the current value Ig of each branch interconnection "g" based on the case of FIG. 10. The current value of each branch interconnection can be analyzed by dividing into each current source. Here, a current flowing into the resistance Rg is $\alpha$ [A] when the current source for supplying a current of 1 [A] as the current source Ia is connected as shown in FIG. 11. A current flowing into the resistance Rg is $\beta$ [A] when a current source for supplying a current of 1 [A] as the current source Ic is connected as shown in FIG. 12. A current flowing into the resistance Rg is $\gamma$ [A] when a current source for supplying a current of 1 [A] as the current source Ih is connected as shown in FIG. 13. In this case, the current value of the resistance Rg (branch interconnection "g") is calculated by a following equation (1) based on the superposition principle.

$$Ig = \alpha Ia + \beta Ic + \gamma Ih \qquad (1)$$

Such a calculation is performed on each branch interconnection generating the loop portion to obtain the current value of each branch interconnection.

Again in FIG. 5, when the current value of each branch interconnection is calculated in the step S13, the current comparison section 4 calculates the current density of each branch interconnection based on the branch current data 15 and the interconnection data 14 of each branch interconnection. Then, the current comparison section 4 compares the current density with the standard current density stored in the EM standard data 16 (Step S14). The comparison result at the step S14 is stored in the memory unit 6 as the verification result data 17 indicating the information as to whether or not the current value of each branch wiring exceeds the standard current density.

As the comparison result at the step S14, if the current density of the branch interconnection exceeds the standard current density, the current comparison section 4 calculates the required minimum interconnection width such that the current density does not exceed the standard current density. This minimum interconnection width is stored in the memory unit 6 as the verification result data 17. If the layout interconnections includes the branch interconnection whose current density exceeds the standard current density, the current comparison section 4 displays the occurrence of an error and the position of the branch interconnection exceeding the standard current density on a display unit (now shown) (Step S15). For example, the branch interconnection exceeding the standard current density is displayed by highlighting the data or the position of the branch interconnection in the displaying screen. At this time, the data with regard to the minimum interconnection width so as not to exceed the standard current density is also displayed on the display unit.

In this embodiment, as for the branch interconnections except the loop portion, the circuit model where the loop portion is replaced with one node is used to calculate the current values of the branch interconnections. As for the branch interconnections in the loop portion, the resistive network corresponding to the loop portion and the current value of the branch interconnection flowing into the loop portion are used to calculate the current value of each branch interconnection. In calculating the current value of the branch interconnection except the loop portion, it is possible to easily calculate the current value of each branch interconnection because the loop portion does not exist in the circuit model. Also, the resistive network corresponding to the loop portion is easy in analysis because the number of the resistance elements and the number of the nodes are little as compared with the case in which the whole of the circuit is replaced with the resistance circuit network. Thus, it is possible to reduce the time required to calculate the current value of each branch interconnection, as a whole.

In analyzing, the resistive network in a transient state is not analyzed, but the relation between the current of the branch interconnection flowing into the loop portion and the current of the branch interconnection inside the loop portion is calculated. The branch interconnection generating the loop portion can be represented as the linear sum of the currents flowing into the loop portion, for example, as represented by the equation (1). It can be calculated by substituting the current value of the branch interconnection flowing into the loop portion. Thus, the calculation can be simplified as compared with the case of analyzing the transient state of the resistive network of the loop portion and calculating the current value of each branch interconnection inside the loop portion.

It is apparent that the present invention is not limited to the above embodiment, that may be modified and changed without departing form the scope and spirit of the invention.

What is claimed is:

1. A method for verifying layout interconnections comprising:
   (a) extracting a loop circuit as a loop portion in a first circuit model, wherein said first circuit model of a semiconductor design, includes:
   branch interconnections which includes first branch interconnections included in said loop portion and other branch interconnections as second branch interconnections,
   first nodes, each of which is connected with an edge of corresponding one of said branch interconnections, and
   terminals of circuit elements, each of which is connected with said edge of corresponding one of said branch interconnections;
   (b) replacing said loop portion with a second node to generate a second circuit model which does not have said loop portion, based on said first circuit model;
   (c) calculating a second current value of each of said second branch interconnections, based on said second circuit model;
   (d) generating a third circuit model of said loop portion, based on said first interconnections;
   (e) calculating a first current value of each of said first branch interconnections, based on said third circuit model; and
   (f) comparing said first and second current value with a predetermined current value to carry out verification.

2. The method for verifying layout interconnections according to claim 1, wherein said step (d) includes:
   (d1) generating said third circuit model which includes a resistive network replacing said first branch interconnections with resistances.

3. The method for verifying layout interconnections according to claim 1, wherein said step (e) includes:
   (e1) calculating said first current value based on values of current flowing through said second branch interconnections into said third circuit model.

4. The method for verifying layout interconnections according to claim 1, wherein said step (f) includes:
   (f1) comparing said first and second current value with a predetermined standard current value to verify whether or not there is a possibility of an occurrence of an short circuit or an electromigration.

5. The method for verifying layout interconnections according to claim 2, wherein said step (e) includes:
   (e1) calculating said first current value based on values of current flowing through said second branch interconnections into said third circuit model.

6. A computer program product embodied on a computer-readable medium and comprising code that, when executed, causes a computer to perform the following method for verifying layout interconnections:
   (a) extracting a loop circuit as a loop portion in a first circuit model, wherein said first circuit model of a semiconductor design, includes:

branch interconnections which includes first branch interconnections included in said loop portion and other branch interconnections as second branch interconnections, first nodes, each of which is connected with an edge of corresponding one of said branch interconnections, and terminals of circuit elements, each of which is connected with said edge of corresponding one of said branch interconnections;

(b) replacing said loop portion with a second node to generate a second circuit model which does not have said loop portion, based on said first circuit model;

(c) calculating a second current value of each of said second branch interconnections, based on said second circuit model;

(d) generating a third circuit model of said loop portion, based on said first interconnections;

(e) calculating a first current value of each of said first branch interconnections, based on said third circuit model; and (f) comparing said first and second current value with a predetermined current value to carry out verification.

7. The computer program product embodied on a computer-readable medium according to claim 6, wherein said step (d) includes:

(d1) generating said third circuit model which includes a resistive network replacing said first branch interconnections with resistances.

8. The computer program product embodied on a computer-readable medium according to claim 6, wherein said step (e) includes:

(e1) calculating said first current value based on values of current flowing through said second branch interconnections into said third circuit model.

9. The computer program product embodied on a computer-readable medium according to claim 6, wherein said step (f) includes:

(f1) comparing said first and second current value with a predetermined standard current value to verify whether or not there is a possibility of an occurrence of an short circuit or an electromigration.

10. The computer program product embodied on a computer-readable medium according to claim 7, wherein said step (e) includes:

(e1) calculating said first current value based on values of current flowing through said second branch interconnections into said third circuit model.

11. A layout interconnections verifying apparatus comprising:

a loop extraction section which extracts a loop circuit as a loop portion in a first circuit model, wherein said first circuit model of a semiconductor design, includes:

branch interconnections which includes first branch interconnections included in said loop portion and other branch interconnections as second branch interconnections, first nodes, each of which is connected with an edge of corresponding one of said branch interconnections, and terminals of circuit elements, each of which is connected with said edge of corresponding one of said branch interconnections;

a loop/node replacement section which replaces said loop portion with a second node to generate a second circuit model which does not have said loop portion, based on said first circuit model;

a outside-loop current calculation section which calculates a second current value of each of said second branch interconnections, based on said second circuit model;

a loop model generation section which generates a third circuit model of said loop portion, based on said first interconnections; and a inside-loop current calculation section which calculates a first current value of each of said first branch interconnections, based on said third circuit model, and compares said first and second current value with a predetermined current value to carry out verification.

12. The layout interconnections verifying apparatus according to claim 11, wherein said loop model generation section generates said third circuit model which includes a resistive network replacing said first branch interconnections with resistances.

13. The layout interconnections verifying apparatus according to claim 11, wherein said inside-loop current calculation section calculates said first current value based on values of current flowing through said second branch interconnections into said third circuit model.

14. The layout interconnections verifying apparatus according to claim 11, wherein said inside-loop current calculation section compares said first and second current value with a predetermined standard current value to verify whether or not there is a possibility of an occurrence of an short circuit or an electromigration.

15. The layout interconnections verifying apparatus according to claim 12, wherein said inside-loop current calculation section calculates said first current value based on values of current flowing through said second branch interconnections into said third circuit model.

* * * * *